(12) United States Patent
Wasynczuk

(10) Patent No.: US 11,045,905 B2
(45) Date of Patent: Jun. 29, 2021

(54) METHOD OF MANUFACTURING AN OBJECT FROM GRANULAR MATERIAL COATED WITH A METALLIC MATERIAL AND A RELATED ARTICLE OF MANUFACTURE

(71) Applicant: The Boeing Company, Chicago, IL (US)

(72) Inventor: James A. Wasynczuk, Bellflower, CA (US)

(73) Assignee: The Boeing Company, Chicago, IL (US)

( * ) Notice: Subject to any disclaimer, the term of this patent is extended or adjusted under 35 U.S.C. 154(b) by 495 days.

(21) Appl. No.: 15/411,386

(22) Filed: Jan. 20, 2017

(65) Prior Publication Data
US 2018/0207749 A1 Jul. 26, 2018

(51) Int. Cl.
*B33Y 10/00* (2015.01)
*B22F 10/20* (2021.01)
(Continued)

(52) U.S. Cl.
CPC ............. *B23K 26/34* (2013.01); *B22F 1/025* (2013.01); *B22F 10/20* (2021.01); *B29C 64/153* (2017.08);
(Continued)

(58) Field of Classification Search
CPC ................... B22F 3/105; B22F 3/1055; B22F 2003/1056; B22F 2003/1057; B22F 2003/1058; B22F 2003/1059
See application file for complete search history.

(56) References Cited

U.S. PATENT DOCUMENTS

2010/0124514 A1* 5/2010 Chelluri .................... B22F 9/04
419/13
2014/0349132 A1 11/2014 Uhlmann et al.
(Continued)

FOREIGN PATENT DOCUMENTS

CN 101012561 8/2007
CN 102554457 7/2012
(Continued)

OTHER PUBLICATIONS

European Office Action dated Apr. 16, 2019 in corresponding European application No. 17 197 758.0.
(Continued)

*Primary Examiner* — Vanessa T. Luk
(74) *Attorney, Agent, or Firm* — Womble Bond Dickinson (US) LLP

(57) ABSTRACT

A method of manufacturing an object is disclosed. In some aspects, the method includes selectively heating an initial layer of a composition, including elements of a granular material coated with a metallic material. The method further includes selectively heating an additional layer of the composition, disposed in contact with the initial layer, the selective heating of each respective layer to the threshold temperature actuating an exothermic reaction between the elements of the granular material and the metallic material coating associated therewith to form a molten portion of the respective layer, with turbulence in the molten portion of the respective layer disrupting oxidation of the molten granular material and promoting formation of an intermetallic compound in the molten portion of the respective layer upon cooling thereof below the threshold temperature, and with the portions of the respective layers combining to form the object.

15 Claims, 4 Drawing Sheets

(51) Int. Cl.

| | |
|---|---|
| *B22F 1/02* | (2006.01) |
| *B23K 26/34* | (2014.01) |
| *C22C 21/02* | (2006.01) |
| *B29C 64/165* | (2017.01) |
| *B29C 64/153* | (2017.01) |
| *B33Y 70/00* | (2020.01) |
| *B33Y 80/00* | (2015.01) |
| *C23C 14/16* | (2006.01) |
| *C23C 14/24* | (2006.01) |
| *C23C 16/06* | (2006.01) |
| *C23C 16/44* | (2006.01) |
| *C23C 18/16* | (2006.01) |
| *C23C 18/32* | (2006.01) |
| *C23C 18/50* | (2006.01) |
| *C25D 3/12* | (2006.01) |
| *C25D 3/54* | (2006.01) |
| *C25D 3/56* | (2006.01) |
| *C25D 15/00* | (2006.01) |
| *B23K 103/10* | (2006.01) |
| *C22C 1/04* | (2006.01) |
| *C22C 19/03* | (2006.01) |
| *B33Y 40/00* | (2020.01) |

(52) U.S. Cl.
CPC ............ *B29C 64/165* (2017.08); *B33Y 10/00* (2014.12); *B33Y 70/00* (2014.12); *B33Y 80/00* (2014.12); *C22C 21/02* (2013.01); *C23C 14/16* (2013.01); *C23C 14/165* (2013.01); *C23C 14/24* (2013.01); *C23C 16/06* (2013.01); *C23C 16/44* (2013.01); *C23C 18/1637* (2013.01); *C23C 18/32* (2013.01); *C23C 18/50* (2013.01); *C25D 3/12* (2013.01); *C25D 3/54* (2013.01); *C25D 3/562* (2013.01); *C25D 15/00* (2013.01); *B22F 2203/11* (2013.01); *B22F 2999/00* (2013.01); *B23K 2103/10* (2018.08); *B33Y 40/00* (2014.12); *C22C 1/0416* (2013.01); *C22C 19/03* (2013.01); *Y02P 10/25* (2015.11)

(56) References Cited

U.S. PATENT DOCUMENTS

| | | | |
|---|---|---|---|
| 2016/0325355 A1 | 11/2016 | Nardi et al. | |
| 2017/0021417 A1* | 1/2017 | Martin | B22F 3/1028 |
| 2017/0021526 A1* | 1/2017 | Joshi | B29C 67/00 |

FOREIGN PATENT DOCUMENTS

| | | |
|---|---|---|
| CN | 102634790 | 8/2012 |
| CN | 103143802 | 6/2013 |
| WO | WO 2016/187624 | 11/2016 |
| WO | WO 2017/011715 | 1/2017 |

OTHER PUBLICATIONS

Airbus Group, "Scalmalloy® RP aluminum-magnesium scandium alloy powder," 2016. http://www.technology-licensing.com/etl/int/en/What-we-offer/Technologies-for-licensing/Metallics-and-related-manufacturing-technologies/Scalmalloy-RP.html.

Andrzejak, T. A., et al., "Ignition mechanism of nickel-coated aluminum particles," *Combustion and Flame*, vol. 150, 2007, pp. 60-70.

ASTM E1226: Standard Test Method for Explosibility of Dust Clouds, (Oct. 23, 2017).

Bartkowiak, K., et al., "New Developments of Laser Processing Aluminum Alloys via Additive Manufacturing Technique," *Physics Procedia*, 2011, vol. 12, pp. 393-401.

Belov, N.A., et al., "Improving the properties of cold-rolled Al—6% Ni sheets by alloying and heat treatment," *Scripta Meterialia*, 2004, vol. 50, pp. 89-94.

Boettge, B., et al., "Fabrication and characterization of reactive nanoscale multilayer systems for low-temperature bonding in microsystem technology," *J. Micromech. Microeng.*, 2010, vol. 20, 064018 (8pp).

Brice, C., et al., "Precipitation behavior of aluminum alloy 2139 fabricated using additive manufacturing," *Materials Science & Engineering A*, 2015, vol. 648, pp. 9-14.

Buchbinder, D. et al., "High Power Selective Laser Melting (HP SLM) of Aluminum Parts," *Physics Procedia*, 2011, vol. 12, pp. 271-278.

Buchbinder, D., et al., "Investigation on reducing distortion by preheating during manufacture of aluminum components using selective laser melting," *Journal of Laser Applications*, 2014, vol. 26(1), pp. 012004-1-012004-10.

Buchbinder, D., et al., "Selective laser melting of aluminum die-cast alloy—Correlations between process parameters, solidification conditions, and resulting mechanical properties," *Journal of Laser Applications*, 2015, vol. 27(S2), pp. S29205-1-S29205-6.

Cahoon, J.R., et al., "The mechanical properties of directionally solidified aluminum-based eutectic castings," *Canadian Metallurgical Quarterly*, 1975, vol. 14(1), pp. 1-17.

Dadbakhsh, S., et al., "Experimental investigation on selective laser melting behavior and processing windows of in situ reacted $Al/Fe_2O_3$ powder mixture," *Powder Technology*, 2012, vol. 231, pp. 112-121.

Dadbakhsh, S., et al., "Effect of Layer Thickness in Selective Laser Melting on Microstructure of $Al/5wt.\%Fe_2O_3$ Powder Consolidated Parts," *The Scientific World Journal*, Oct. 2013, vol. 2014, pp. 1-10.

Dean, S. W., et al., "Energetic intermetallic materials formed by cold spray," *Intermetallics*, 2013, vol. 43, pp. 121-130.

Fukui, Y., et al., "Bending strength of an $Al—Al_3Ni$ functionally graded material," *Composites Part B*, 1997, vol. 28B, pp. 37-43.

Fulcher, B. A., et al., "Comparison of AlSi10Mg and AL 6061 Processed Through DMLS," *25th Annual International Solid Freeform Fabrication Symposium*, University of Texas, Austin, TX, Aug. 4-6, 2014, pp. 404-419.

George, F.D., et al., "The Effect of Fiber Orientation and Morphology on the Tensile Behavior of $Al_3Ni$ Whisker Reinforced Aluminum," *Metal Matrix Composites*, ASTM STP 438, 1968, pp. 59-75.

Hall, A. C., Powder Safety Awareness for Additive Manufacturing, Sandia Report SAND2014-19158PE 540751 (2014) http://www.osti.gov/scitech/biblio/1242062.

Hanyaloglu, S.C., et al. "Reactive sintering of electroless nickel-plated aluminum powders," *Materials Characterization*, 2001, vol. 47, pp. 9-16.

Krishaveni, K., et al., "Electroless Ni—B coatings: preparation and evaluation of hardness and wear resistance," *Surface & Coatings Technology*, 2005, vol. 190, pp. 115-121.

Lawson, W.H.S., et al., "Mechanical Behavior of Rapidly Solidified $Al—Al_2Cu$ and $Al—Al_3Ni$ Composites," *Metallurgical Transactions*, 1971, vol. 2, pp. 2853-2859.

Louvis, E., et al., "Selective laser melting of aluminium components," *Journal of Materials Processing Technology*, vol. 211(2), Feb. 1, 2011, pp. 275-284.

Macaskill, I. A., et al., "Reaction sintering of intermetallic-reinforced composite materials," *J. Mater. Sci.*, 2007, vol. 42, pp. 4149-4158.

Metals Handbook on-line, 1990, vol. 2, pp. 62-122, 123-151; & 2016, vol. 3, pp. 113-139.

Morsi, K., "Review: reaction synthesis processing of Ni—Al intermetallic materials," *Materials Science and Engineering*, 2001, vol. A299, pp. 1-15.

Naiborodenko, Y.S., et al., "Gasless Combustion of Mixtures of Metal Powders II. Effect of Mixture Combustion on the Combustion Rate and the Phase Composition of the Products," *Combustion, Explosion and Shock Waves*, Sep. 1975, vol. 11(5), pp. 626-629.

Olakanmi, E.O., et al., "A review on selective laser sintering/melting (SLS/SLM) of aluminum alloy powders: Processing, microstructure, and properties," *Progress in Materials Science*, 2015, vol. 74, pp. 401-477.

(56) References Cited

OTHER PUBLICATIONS

Rajan, T.P.D., et al., Functionally graded Al—Al3Ni in situ intermetallic composites: Fabrication and microstructural characterization, Journal of Alloys and Compounds 453 (2008) L4-L7.

Schmid, G.H.S., et al., "A method for uniformly coating powdery substrates by magnetron sputtering," *Surface and Coatings Technology*, 2013, vol. 236, pp. 353-360.

Schmidtke, K., et al., "Process and Mechanical Properties: Applicability of a Scandium modified Al-alloy for Laser Additive Manufacturing," *Physics Procedia*, 2011, vol. 12, pp. 369-374.

Schneider, M., et al., "Measurement of laser absorptivity for operating parameters characteristic of laser drilling regime," *Journal of Physics D: Applied Physics*, 2008, vol. 41(15), pp. 6.

Shafirovich, E., et al., "Ignition of single nickel-coated aluminum particles," *Proceedings of the Combustion Institute*, 2005, vol. 30, pp. 2055-2062.

Sher, D., "Fraunhofer ILT Presents New Multispot SLM Machine Design," 3D Printing Industry, 2014. http://3dprintingindustry.com/2014/12/1/fraunhofer-slm-machine/.

Sundaram, D. S., et al., "Effect of packing density on flame propagation of nickel-coated aluminum particles," *Combustion and Flame*, 2014, vol. 161, pp. 2916-2923.

Thiers, L., et al., Thermal Explosion in Ni—Al System: Influence of Reaction Medium Microstructure, Combustion and Flame 131 (2002) 131-198.

Tregilgas, J.H., et al., "Tensile properties of directionally solidified Al—$Al_3$Ni composites with off-eutectic compositions," *Journal of Materials Science*, 1976, vol. 11, pp. 1239-1245.

Vayre, B., et al., "Identification on some design key parameters for additive manufacturing: application on Electron Beam Melting," *Fourty Sixth CIRP Conference on Manufacturing Systems*, 2013, pp. 264-269.

Zhu, P., et al., "Adiabatic temperature of combustion synthesis of Al—Ni systems," *Materials Science and Engineering*, 2003, vol. A357, pp. 248-257.

Chinese Office Action dated Jul. 27, 2020 in corresponding Chinese application No. 201711180815.2.

Chinese Office Action dated Jan. 4, 2021, in corresponding Chinese application No. 201711180815.2.

* cited by examiner

METHOD OF MANUFACTURING AN OBJECT FROM GRANULAR MATERIAL COATED WITH A METALLIC MATERIAL AND A RELATED ARTICLE OF MANUFACTURE

BACKGROUND

In the aerospace industry, the production of aluminum and/or aluminum alloy objects (e.g., components, parts, etc.) by additive manufacturing is an undeveloped market. This is due to metallurgical challenges associated with producing aluminum and/or aluminum alloy components by additive manufacturing. For example, in a selective laser melting (SLM) process, proper fusion of the granular aluminum feedstock material is inhibited by factors that include high reflectivity of laser light, high thermal conductivity, and a very strong tendency for the aluminum in the feedstock material to oxidize. Consequently, SLM-produced aluminum and/or aluminum alloy objects generally cannot compete against incumbent benchmarks such as traditionally machined wrought aluminum and/or aluminum alloys.

In order to promote proper fusion of the granular feedstock material, many different methods have been attempted. Such methods include changes to manufacturing machinery, the use of granular feedstock alloys with compositions close to a low melting temperature aluminum-silicon eutectic, and the like. While some of these methods are able to mitigate one or more of factors inhibiting proper fusion of the granular feedstock material (e.g., high laser light reflectivity and high thermal conductivity), such methods generally do not effectively address oxide formation, which is commonly known as the chief inhibitor to proper fusion of aluminum feedstock material.

Even in carefully controlled atmospheres, oxidation of aluminum produces an "oxide skin" that tends to inhibit fusion of granular feedstock material. In a solidified microstructure, an effect of the oxide skin is manifested as oxide particles having an unfavorably large size and volume fraction and that those oxide particles form between build layers of the object. Fractographic imaging of objects manufactured from SLM indicate that such objects display quality and performance properties that are inferior to traditionally machined wrought aluminum and/or aluminum alloys.

SUMMARY OF THE DISCLOSURE

A method of manufacturing an object from granular material coated with a metallic material is disclosed. In some aspects, the method includes selectively heating an initial layer of a composition, comprising elements of a granular material coated with a metallic material, to a threshold temperature. An additional layer of the composition, disposed in contact with the initial layer, is selectively heated to the threshold temperature, the selective heating of each respective layer to the threshold temperature actuating an exothermic reaction between the elements of the granular material and the metallic material coating associated therewith to form a molten portion of the respective layer, with turbulence in the molten portion of the respective layer disrupting oxidation of the molten granular material and promoting formation of an intermetallic compound in the molten portion of the respective layer upon cooling thereof below the threshold temperature, and with the portions of the respective layers combining to form the object.

In other aspects, an article of manufacture includes a composition comprising one or more layers of elements of a granular material coated with a metallic material, each of the one or more layers of the elements of the granular material having been selectively heated to a threshold temperature so as to actuate an exothermic reaction within the respective layer between the elements of the granular material and the metallic material coating associated therewith and to form a molten portion of the one or more respective layers, with turbulence in the molten portion of the one or more respective layers having disrupted oxidation of the molten granular material and having promoted formation of an intermetallic compound in the molten portion of the one or more respective layers upon cooling thereof below the threshold temperature.

In still further aspects, a method of manufacturing an object includes selectively heating a layer of a composition, comprising elements of a granular material coated with a metallic material, to a threshold temperature so as to actuate an exothermic reaction between the elements of the granular material and the metallic material coating associated therewith and to form a molten portion of the layer, with turbulence in the molten portion of the layer disrupting oxidation of the molten granular material and promoting formation of an intermetallic compound in the molten portion of the layer upon cooling thereof below the threshold temperature.

The aspects, functions and advantages discussed herein may be achieved independently in various example implementations/aspects or may be combined in yet other example implementations/aspects, further details of which may be seen with reference to the following description and drawings.

BRIEF DESCRIPTION OF THE DRAWINGS

Figure 1:
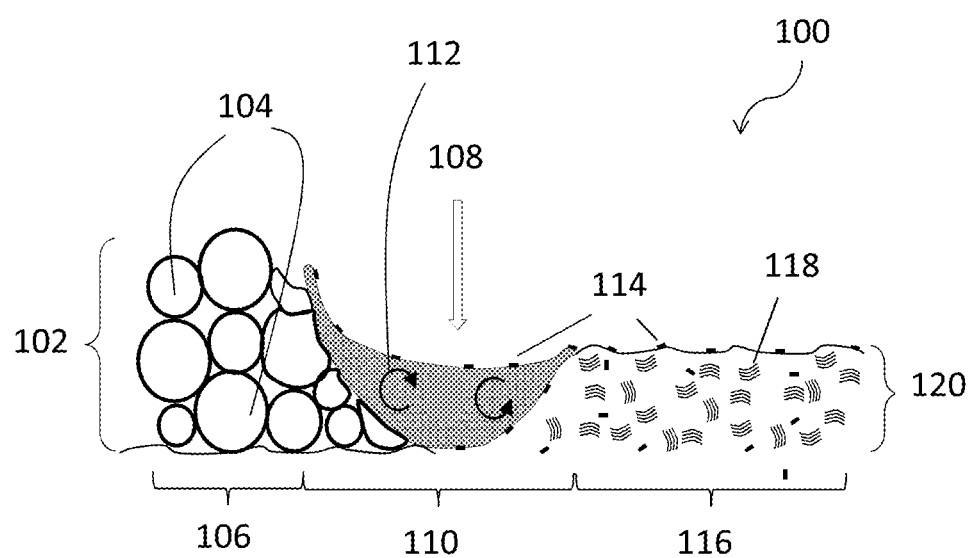
Figure 2:
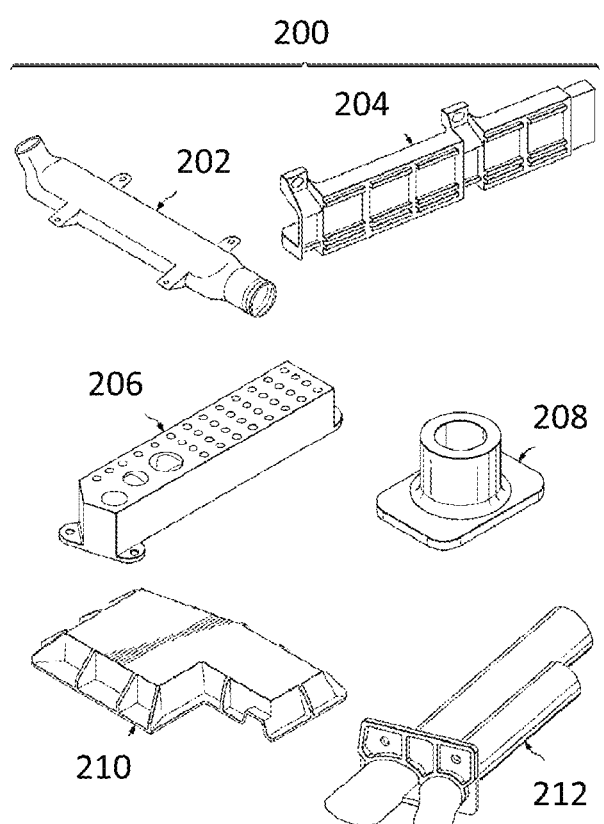
Figure 3:
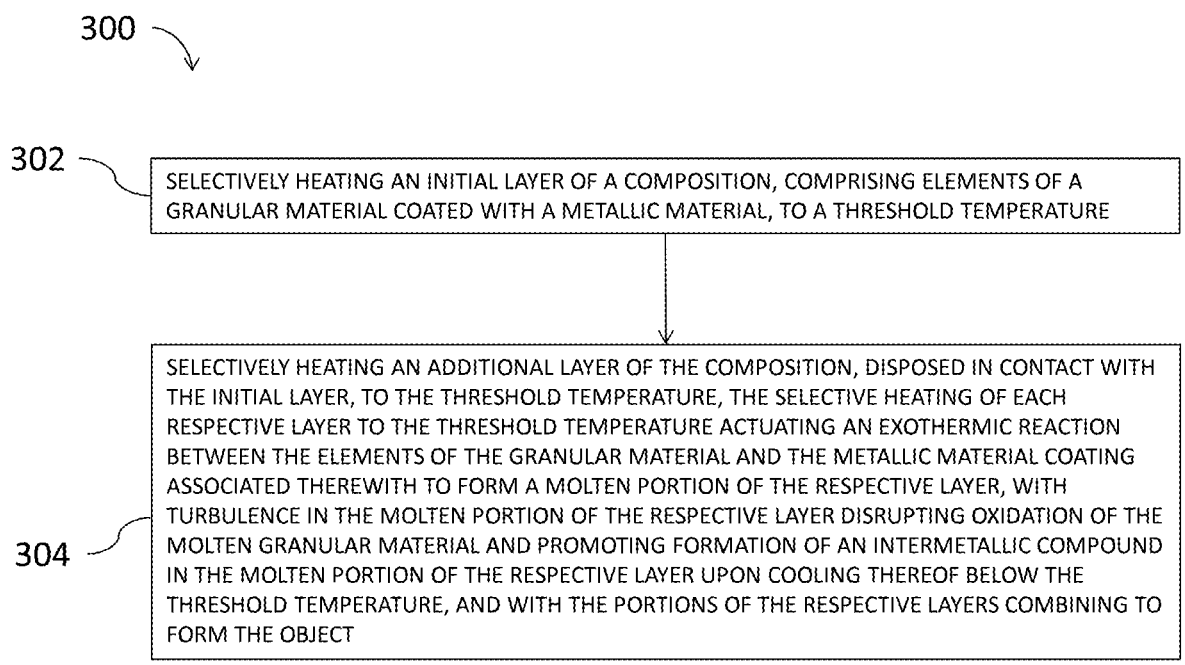
Figure 4:
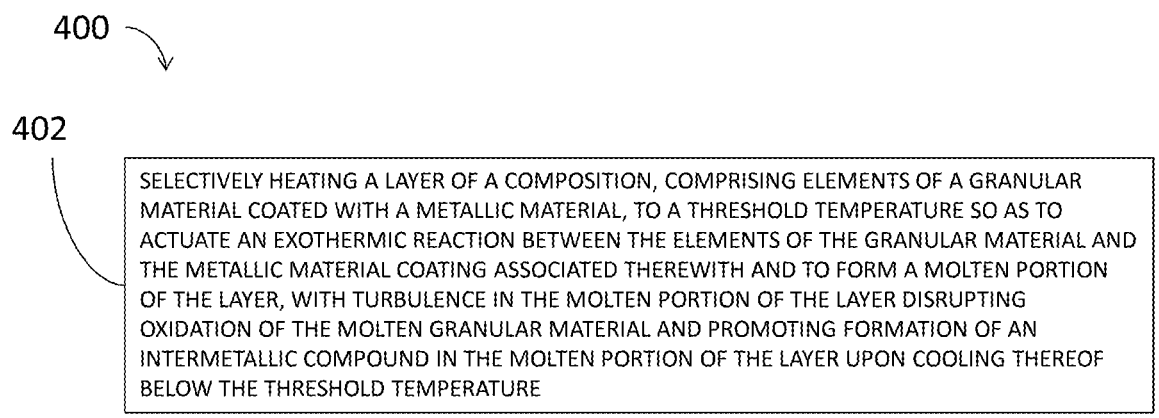

Having thus described the disclosure in general terms, reference will now be made to the accompanying drawings, which are not necessarily drawn to scale, and wherein:

FIG. 1 is a schematic illustrating a layer of a composition comprising elements of a granular material coated with a metallic material according to exemplary aspects of the disclosure provided herein;

FIG. 2 is a schematic illustrating various objects that are capable of being manufactured by an additive manufacturing process from a composition comprising elements of a granular material coated with a metallic material according to exemplary aspects of the disclosure provided herein;

FIG. 3 is a method flow diagram of a method of manufacturing an object from granular material coated with a metallic material according to exemplary aspects of the disclosure provided herein; and FIG. 4 is a method flow diagram of a method of manufacturing an object from granular material coated with a metallic material according to further exemplary aspects of the disclosure provided herein.

DETAILED DESCRIPTION OF THE DISCLOSURE

The present disclosure now will be described more fully hereinafter with reference to the accompanying drawings, in which some, but not all aspects of the disclosure are shown. Indeed, the disclosure may be embodied in many different forms and should not be construed as limited to the aspects set forth herein; rather, these aspects are provided so that this disclosure will be thorough and complete, will fully convey the scope of the disclosure to those skilled in the art, and will satisfy applicable legal requirements. Like numbers refer to like elements throughout. As used in this specification and the claims, the singular forms "a," "an," and "the" include plural referents unless the context clearly dictates otherwise.

As previously disclosed, producing an article of manufacture or object (e.g., a component, a part, etc.) from aluminum or aluminum alloys using an additive manufacturing process, such as, for example, selective laser melting (SLM), selective laser sintering (SLS), etc., tends to be problematic. This is due to the oxidation of aluminum that occurs during the additive manufacturing process, wherein such oxidation results, in some instances, in the formed objects having lesser mechanical and material properties as compared to established benchmark properties of the aluminum material. Lesser mechanical and material properties can be problematic for such SLM-produced objects utilized for aerospace applications, which require adherence to strict tolerances due to extreme conditions to which the objects are subjected.

Typical manufacturing machinery used in additive manufacturing processes includes a computing platform or other type of processor device running computer aided design (CAD) software on which a digital design of the object is used to selectively heat individually distributed layers of aluminum or aluminum alloy feedstock material. A work piece platform or other type of substrate is also included in typical manufacturing machinery. Each layer of the aluminum or aluminum alloy feedstock material is distributed on the work piece platform and then selectively melted by an energy source. For example, a high-power laser (e.g., an ytterbium fiber laser) emitting a high-power laser beam is used to melt selected portions of each layer per the digital design of the object. Where the laser beam has heated the aluminum or aluminum alloy feedstock material to a threshold or melt temperature, the aluminum or aluminum alloy feedstock material melts and forms a molten portion of that layer. Subsequent cooling of the molten zone results in solidification of the aluminum or aluminum alloy feedstock material. The method is repeated layer after layer until the part is complete.

Yet, merely changing the manufacturing machinery used in the additive manufacturing processes is insufficient for addressing the oxidation of aluminum in the process of forming the object. Changes such as heating the work piece platform, using multiple or higher power laser beams, using an electron beam, and the like, still do not effectively disrupt oxidation of the aluminum in the aluminum feedstock material. Thus, in one aspect, it is desirable to modify the feedstock material, itself, in an attempt to disrupt oxidation of the aluminum in the process of forming the part.

The existing methods to improve the performance and quality of additively manufactured aluminum alloy parts by changing feedstock chemistry have achieved limited success, and this success is typically measured against the lackluster benchmark of samples that were produced by traditional casting methods, or additively manufactured from granular feedstock material with compositions similar to traditional wrought alloys. This limited success is obtained by using uncoated granular feedstock material with composition similar to traditional casting alloys. Presently, the most common feedstock material for aluminum additive manufacturing is AlSi10Mg (Al/9-11 Si/0.25-0.45 Mg percent by weight), with a composition that is almost the same as the die casting alloy AMS 4290 (9.5 Si/0.50 Mg percent by weight), and not far from the aluminum-silicon eutectic (Al-12 Si percent by weight). However, compositions close to the Al—Si eutectic inherently produce microstructures that have a high (more than 10 percent by lever rule) volume fraction of brittle silicon particles. Consequently, SLM-produced parts with compositions near the Al—Si eutectic will tend to have strength and ductility that are inferior to the incumbent benchmark of machined wrought alloys, despite the finer sized microstructural features that are associated with the rapid solidification of the molten zone. Parts made with compositions near the 577° C. Al—Si eutectic will also tend to have limited elevated temperature strength, and this is particularly important for many aerospace applications.

Accordingly, an improved method of manufacturing an object and a related article of manufacture is disclosed herein that promotes fusion of the feedstock material and disrupts oxidation of aluminum in order to produce objects having performance characteristics that meet and exceed incumbent benchmarks. The feedstock material, referred to hereinafter as a "composition", comprises elements of granular material, which in some aspects comprises aluminum or aluminum alloy, that is coated with a metallic material, which in some aspects comprises nickel, titanium, or alloys thereof.

Advantageously, application of such a composition in SLM, upon selective heating, results in an exothermic reaction between the coating and the granular material. The exothermic reaction expands the molten portion of each layer and enhances turbulence therein, as compared with the molten portion and turbulence that result from the laser melting of uncoated feedstock material. In turn, the enhanced turbulence in the molten portion sufficiently disrupts oxidation of the granular material so that any oxide particles are discretely spaced apart from one another and favorably dispersed.

Notably, while granular material of aluminum or an aluminum alloy is described herein, it is noted that the disclosed method is not limited thereto. Likewise, while a metallic coating of nickel, titanium, or alloys thereof is described herein, it is noted that the disclosed method is not limited thereto. Furthermore, the additive manufacturing processes described herein are not limited to SLM, but encompass any additive manufacturing process for producing objects, e.g., parts or components, for aerospace applications or the like.

FIG. 1 illustrates a schematic, generally designated 100, of a layer 102 of a composition or feedstock material 104, comprising elements of granular material coated with a metallic material. As illustrated in FIG. 1, the layer 102 comprises a portion or region, generally designated 106, of elements of the composition 104. In some aspects, the portion or region 106 comprises heated elements of the composition 104, while in other aspects, the portion or region 106 comprises unheated elements of the composition. In the portion or region 106 illustrated in FIG. 1, the elements of the composition 104 have not yet been selectively heated by the energy beam 108. However, in some aspects, the elements of the composition 104 in the portion or region 106 are pre-heated via a heated powder bed (not illustrated) on which the elements of the composition 104 are distributed.

By contrast, the layer 102 in FIG. 1 also comprises a molten portion or region of the composition 104 that has been heated to or above a threshold temperature. The selective heating of the layer 102 (or any respective layer) to the threshold temperature actuates an exothermic reaction between the elements of the granular material and the metallic material coating, generally designated 110, and a solidified portion or region of the composition 104 that has cooled from above the threshold temperature to below the threshold temperature, generally designated 116.

In one aspect, the composition 104 includes the elements of granular material with the metallic material coating in the form of a plurality of discrete particles. The granular material, in some aspects, comprises an aluminum or an aluminum alloy, while the metallic coating, in some aspects, comprises nickel, titanium, or alloys thereof. In some aspects, it is desirable to prepare a composition having elements of aluminum or an aluminum alloy and a nickel or nickel alloy coating, e.g., near an Al—Al$_3$Ni eutectic. In some aspects, all elements of the layer 104 are of composition 104. In other aspects, only a fraction of the elements of the layer 102 are of composition 104, with the remainder of the elements being uncoated. In other aspects, it is advantageous to have only a fraction of the granular particles coated with the coating, which in turn lowers the content of the metallic material forming the coating in the solidified. For example, in this instance, only a fraction of the elements of the granular material forming the layer 102 is an aluminum or an aluminum alloy having a nickel or nickel alloy coating, with a remaining fraction of the elements being an aluminum or an aluminum alloy devoid of a nickel or nickel alloy coating.

In some aspects, each granular material particle (e.g., an aluminum or aluminum alloy particle) comprises a particle diameter of between about 20 micrometers and about 150 micrometers. In some aspects, it is desirable for the granular material particles to have a diameter of about 50 micrometers. Particles of the granular material having a diameter either larger or smaller than that specifically described herein are also contemplated, wherein the particle diameter is linked to or otherwise associated with exothermic reactions that occur between the granular material and the metallic coating upon being selectively heated, and the microstructure that results after the composition 104 has solidified.

In some aspects, each particle or only a portion of the plurality of particles of the granular material is coated with the metallic material. In other aspects, only a fraction of the particles of the granular material is coated with the metallic material. In some aspects, coating of the granular material with the metallic material is accomplished using an electroless plating process, an electrolytic plating process, a sputtering process, a chemical vapor deposition process, or another vapor deposition process in order to provide a substantially uniform coating onto the granular material. In such aspects, the particles of the granular material are coated with the metallic material prior to distribution and/or heating of the layer 102 of the composition 104.

The metallic material coating, in some aspects, is applied to the particles of the granular material to a thickness of between about 0.1 micrometers and about 1 micrometer. Notably, the thickness of the metallic coating is associated with a weight fraction of the coating of the metallic material relative to a weight of the overall particle (e.g., the granular material particle and the metallic material coating.)

Accordingly, the weight fraction of the coating of the metallic material is determinable from EQUATION 1, which includes the simplifying assumption of a spherical granular particle. Although the instant disclosure does not contemplate that each particle of the granular material comprises any of the same elements as that of the coating, it is possible that the granular material and the metallic coating share similar elements (e.g., both contain nickel).

$$w_{coating} = [\rho_{coating}[(4\pi/3)(D/2+h)^3 - (4\pi/3)(D/2)^3]$$
$$[\rho_{core}/-(4\pi/3)(D/2)^3] \quad \text{EQUATION 1}$$

$w_{coating}$=weight fraction of metallic material coating
$\rho_{coating}$=density of metallic material coating
$\rho_{core}$=density of particle of granular material
D=diameter of spherical particle of granular material
h=thickness of metallic material coating Notably, it is desirable to optimize the coating thickness of the metallic material, making it sufficiently thick to generate an adequate amount of exothermic reaction, yet not so thick that the resulting intermetallic compound becomes excessive, and the density of the composition becomes excessive. Thus, a desirable weight fraction of the metallic material coating is between about 3.8 and about 29.2 percent by weight, and more desirably between about 5.7 and about 24.2 percent by weight nickel.

Accordingly, in some aspects, a density of the composition is determinable from EQUATION 2 once the weight fraction of the metallic material coating is known (e.g., from EQUATION 1).

$$\rho_{composition} = (1-w_{coating})\rho_{core} + w_{coating}\rho_{coating} \quad \text{EQUATION 2}$$

$\rho_{composite}$=density of the composition

Notably, the optimization of the coating thickness will make the density of the composition as low as practical. This is because it is known that, at higher composition densities, weight-normalized performance properties, such as specific stiffness, are reduced, and weight-normalized performance properties are inherently important in aerospace applications.

In some aspects, the layer 102 illustrated in FIG. 1 is a generic layer of the composition 104 (e.g., the metallic material-coated granular material) that is distributed adjacent to, above, below, or otherwise in contact with another layer. More particularly, the layer 102 is configured to be distributed in a substantially even layer on either a work piece platform or a substrate, where the layer 102 is an initial layer, or is distributed adjacent to, above, or otherwise is configured to be in contact with a previously distributed layer, if the layer 102 is an additional layer, such as a second layer, a third layer, a fourth layer, etc. Thus, an object (e.g., objects 200, FIG. 2) is produced by the serial formation or "build up" of multiple layers 102. In some aspects, the layers 102 in the build-up have a similar or different composition of elements relative to one another.

Distribution of the layer 102 is accomplished, prior to selective heating, using a distribution or spreading mechanism or otherwise is distributed or dispersed manually by a human user. The layer 102 is distributed or dispersed substantially evenly such that the layer 102 has a thickness of between about 20 micrometers and about 150 micrometers relative to the previous layer or the work piece platform. In some aspects, it is desirable for the layer 102 to have a thickness of about 50 micrometers.

After distribution of the layer 102, the layer 102 of the composition 104 is selectively heated to a threshold temperature at which the elements of the composition 104 begin to melt. Because heating with a laser beam is rapid, the generally accepted temperatures for equilibrium physical and chemical reactions can only provide an approximation of the threshold temperature. For example, when the composition 104 comprises aluminum coated with nickel, a person of ordinary skill in the art will appreciate that the threshold temperature is in the vicinity of the melting temperature of aluminum, 660.5° C. In other aspects, the granular material may be an aluminum alloy with a lower melting temperature, and a correspondingly lower threshold temperature. In other aspects, the coating may be an alloy of nickel or titanium, with the elements of this alloy suitably altering the threshold temperature.

In some aspects, the composition 104 is selectively heated by an energy source emitting an energy beam, generally designated 108. The energy beam 108, in some aspects, is emitted by an energy source such as a high-powered laser, e.g., as a ytterbium fiber laser, a carbon dioxide laser, etc. or a higher-powered electron emitting device. In order to selectively heat the layer 102, the energy source is controllable by a control device (not illustrated) or other type of computing platform associated therewith having at least one hardware processor and memory. In this manner, the control device is configured to instruct or otherwise control which portion(s) of the layer 102 is/are heated by the energy beam 108. These instructions or controls are based, in some aspects, on a two-dimensional slice of a three-dimensional preconfigured design of the object stored in the control device or computing platform (i.e., the three-dimensional object is formed as a series of two-dimensional slices or layers.)

As a result, when the energy beam 108 of the energy source heats regions or portions of the layer 102 of the composition 104 to the threshold temperature, an exothermic reaction is actuated within the elements of the composition 104, e.g., the granular material coated with the metallic material, disposed at the heated regions or portions of the layer 102. Notably, as described herein, heating regions or portions of the layer 102 of the composition 104 "to the threshold temperature" comprises heating regions or portions of the layer 102 to at least the threshold temperature, such that the threshold temperature is the minimum temperature to which the regions or portions of the layer 102 are heated. In some aspects, for example, where the composition 104 comprises aluminum and/or an aluminum alloy and a nickel coating, the exothermic reaction causes a large and rapid temperature rise as the aluminum melts and reacts with the adjacent nickel.

FIG. 1 illustrates the molten portion 110, which is adjacent to the portion 106 of the composition 104 not heated above the threshold temperature. The molten portion 110, in some aspects, is configured to expand to previous layers such that upon solidification of the molten portion 110, multiple layers 102 fuse or combine together.

Of note is that, due to the exothermic reaction, the molten portion 110 is expanded within the layer 102, compared to additive manufacturing processes using compositions having uncoated elements. Additionally, the expanded molten portion 110 allows the thickness of layer 102 to be larger, and correspondingly the thickness of the solidified layer is expanded compared to additive manufacturing processes using compositions having uncoated elements. The collective expansion of the regions is advantageous as it reduces a number of layers needed, as each layer 102 solidifies and is thicker than build-up layers of a conventional feedstock material and the number of passes of the energy source is reduced. This results in faster build-up times so that objects are manufactured more quickly, and low manufacturing rate is a well-known shortcoming of conventional additive manufacturing processes such as selective laser melting.

As illustrated in FIG. 1, the energy beam 108 is directed over the molten portion 110, having just heated the elements of the composition 104 to the threshold temperature. After heating, the energy beam 108 is configured to be directed to another portion of the layer 102, e.g., unheated portion 106, or is configured to pause the selective heating until another layer 102 is distributed on top of or adjacent to the previous layer 102.

In some aspects, the exothermic reaction creates turbulence 112 in the molten portion 110. FIG. 1 illustrates the turbulence 112 as small vortices, which disrupt oxidation of the granular material. Notably, oxidation of feedstock material is one of the chief impediments to proper fusion thereof. For example, where a feedstock material comprises a granular material of aluminum or an aluminum alloy, the aluminum or aluminum alloy is prone to oxidization, which lessens the structural integrity of the finished object. Thus, by coating the granular material with a metallic coating, e.g., nickel or titanium, the actuated exothermic reaction creates enough turbulence within the molten portion 110 such that oxide particles 114 are formed in a discrete and dispersed manner, rather than in an "oxide skin", due to the disrupted oxidation of the granular material. The oxide particles 114 are illustrated in FIG. 1 as forming around a perimeter of the molten portion 110, as well as being discrete and dispersed throughout the solidified portion 116.

The solidified portion 116 has a thickness illustrated by reference numeral 120. In other words, the thickness 120 of the solidified portion 116 is what is known in the art as a "build-up layer". As each layer 102 is selectively heated and cooled, the object is slowly built from each layer.

Notably, and as described above, the thickness 120 of the solidified portion 116 is advantageously thicker than conventional layers using uncoated elements in its feedstock material, due to the exothermic reaction. The solidified portion 116 of the layer 102 includes discrete particles or eutectic colonies of an intermetallic compound 118 which is a product of the exothermic reaction of the elements of the composition 104. For example, in one instance, the intermetallic compound 118 comprises $Al_3Ni$ or $Al_3Ti$, depending on the type of granular material and metallic coating.

In some aspects, the intermetallic compound 118 is distributed as discrete particles or colonies throughout the solidified portion 116. In some aspects, where the composition 104 comprises elements similar to an $Al$—$Al_3Ni$ eutectic, the intermetallic compound 118 is precipitated in the form of rods. The intermetallic compound 118 distributed in such a manner advantageously provides a solidified microstructure that yields performance properties superior to existing benchmarks based on objects produced by SLM feedstock with composition similar to traditional casting alloys and thereof close to the aluminum silicon eutectic.

In some aspects, the composition includes chemical species that promote precipitation hardening of the aluminum. As is known by those skilled in the art, precipitation hardening is the chief strengthening mechanism in traditional wrought alloys. The microscopic precipitates responsible for this hardening are too small to be suitably represented in FIG. 1. As is known by those skilled in the art, the presence of certain microscopic precipitates, combined with previously described intermetallic particles, can promote improved elevated temperature strength properties.

The oxide particles 114 are also illustrated in FIG. 1 as being in spaced apart relation to each other in the solidified portion 116. In the solidified portion 116, the oxide particles 114 are advantageously dispersed and discretely formed in a manner that does not decrease performance properties of the manufactured object. More particularly, an object formed from the composition disclosed herein advantageously comprises performance properties (e.g., specific strength, specific stiffness, etc.) similar to traditionally machined-wrought alloys.

With reference now to FIG. 2, a diagram illustrating articles of manufacture or objects, generally designated 200, that are able to be manufactured by way of an additive manufacturing process, e.g., SLM, using a composition comprising elements of a granular material coated with a metallic material is disclosed. In one example, the composition used to manufacture these objects 200 is near an Al—Al₃Ni eutectic, although other compositions or feedstock materials are also contemplated. The objects 200 include, for example, a duct 202, an electrical shroud 204, a power distribution panel 206, a fitting 208, a closure 210, a conduit 212. Other objects suitable for aerospace purposes and the like are also contemplated. Many other types of objects, other than these illustrative examples, are able to be manufactured using an appropriate composition (e.g., composition 104, FIG. 1) for additive manufacturing processes (e.g., SLM), as described herein.

FIG. 3 illustrates a method flow diagram of a method, generally designated 300, of manufacturing an object. In some aspects, the method of manufacturing comprises an additive manufacturing process, such as, for example, SLM.

In step 302, an initial layer 102, FIG. 1) of a composition (e.g., element 104, FIG. 1) comprising elements of a granular material coated with a metallic material is selectively heated to a threshold temperature.

In step 304, an additional layer (e.g., element 102, FIG. 1) of the composition, disposed in contact with the initial layer, is selectively heated to the threshold temperature, the selective heating of each respective layer to the threshold temperature actuating an exothermic reaction between the elements of the granular material and the metallic material coating associated therewith to form a molten portion (e.g., element 110, FIG. 1) of the respective layer with turbulence in the molten portion of the respective layer disrupting oxidation of the molten granular material and promoting formation of an intermetallic compound in the molten portion of the respective layer upon cooling thereof below the threshold temperature, and with the portions of the respective layers combining to form the object (e.g., element 200, FIG. 21.

FIG. 4 illustrates another exemplary method flow diagram of a method, generally designated 400, of manufacturing an object. In some aspects, the method of manufacturing comprises an additive manufacturing process, such as, for example, SLM.

In step 402, a layer (e.g., 102, FIG. 1) of a composition (e.g., element 104. FIG. 1) comprising elements of a granular material coated with a metallic material is selectively heated to a threshold temperature so as to actuate an exothermic reaction between the elements of the granular material and the metallic material coating associated therewith and to form a molten portion (e.g., element 110, FIG. 1) of the layer, with turbulence in the molten portion of the layer disrupting oxidation of the molten granular material and promoting formation of an intermetallic compound in the molten portion of the layer upon cooling thereof below the threshold temperature.

Many modifications and other aspects of the disclosures set forth herein will come to mind to one skilled in the art to which these disclosures pertain having the benefit of the teachings presented in the foregoing descriptions and the associated drawings. Therefore, it is to be understood that the disclosures are not to be limited to the specific aspects disclosed and that equivalents, modifications, and other aspects are intended to be included within the scope of the appended claims. Although specific terms are employed herein, they are used in a generic and descriptive sense only and not for purposes of limitation.

That which is claimed:

1. A method of manufacturing an object comprising:
   determining a thickness of a metallic material coating comprising nickel for coating particles of a granular material based on a desired weight fraction of the metallic material coating relative to a weight of the overall particle of the granular material coated with the metallic material coating, wherein the desired weight fraction of the metallic material coating comprising nickel is between 3.8 and 29.2 percent by weight;
   coating the particles of the granular material with the metallic material coating having the determined thickness;
   selectively heating an initial layer of a composition, comprising the particles of the granular material coated with the metallic material comprising nickel, to a threshold temperature using a laser in a selective laser melting (SLM) process; and
   selectively heating an additional layer of the composition comprising the particles of the granular material coated with the metallic material comprising nickel, disposed in contact with the initial layer, to the threshold temperature using the laser in the SLM process, the selective heating of each respective layer to the threshold temperature actuating an exothermic reaction between the particles of the granular material and the metallic material coating associated therewith to form a molten portion of the respective layer including molten granular material, with turbulence in the molten portion of the respective layer disrupting oxidation of the molten granular material and promoting formation of an intermetallic compound in the molten portion of the respective layer upon cooling thereof below the threshold temperature, and with the portions of the respective layers combining to form the object.

2. The method according to claim 1, comprising distributing the initial layer of the composition on a substrate such that the initial layer has a thickness of between about 20 micrometers and about 150 micrometers, prior to selectively heating the initial layer.

3. The method according to claim 2, wherein distributing the additional layer of the composition in contact with the initial layer comprises distributing the additional layer of the composition in contact with the initial layer, the composition of the additional layer having the same or different particles than the composition of the initial layer.

4. The method according to claim 1, comprising distributing the additional layer of the composition in contact with the initial layer such that the additional layer has a thickness of between about 20 micrometers and about 150 micrometers, prior to selectively heating the additional layer.

5. The method according to claim 4, wherein distributing the additional layer of the composition in contact with the initial layer comprises distributing the additional layer of the composition in contact with the initial layer, the composition of the additional layer having the same or different particles than the composition of the initial layer.

6. The method according to claim 1, wherein coating the particles of the granular material comprises coating the particles of the granular material using an electroless plating process, an electrolytic plating process, a sputtering process, a chemical vapor deposition process, or other vapor deposition processes.

7. The method according to claim 1, wherein coating the particles of the granular material comprises coating the particles of the granular material with the metallic material such that the coating has a thickness of between about 0.1 micrometers and about 1 micrometer.

8. The method according to claim 1, wherein selectively heating the initial layer or selectively heating the additional layer comprises selectively heating the initial layer or selectively heating the additional layer, the initial layer or the additional layer comprising the particles of an aluminum powder or an aluminum alloy powder coated with the metallic material, to the threshold temperature.

9. The method according to claim 8, wherein selectively heating the initial layer comprises selectively heating the initial layer comprising the particles of the aluminum powder or the aluminum alloy powder coated with the metallic material.

10. The method according to claim 8, wherein selectively heating the additional layer comprises selectively heating the additional layer comprising the particles of the aluminum powder or the aluminum alloy powder coated with the metallic material.

11. The method according to claim 1, comprising cooling the molten portion of the initial layer or the additional layer to a solidification temperature, the solidification temperature being less than the threshold temperature, so as to solidify the portion of the initial layer or the additional layer, with the solidified portion of the initial layer or the additional layer comprising discrete particles or eutectic colonies of the intermetallic compound and with oxide particles produced from the disrupted oxidation of the molten granular material being in spaced apart relation to each other.

12. The method according to claim 11, comprising cooling the molten portion of the initial layer to the solidification temperature so as to solidify the portion of the initial layer, with the solidified portion of the initial layer comprising the discrete particles or eutectic colonies of the intermetallic compound and with the oxide particles produced from the disrupted oxidation of the molten granular material being in spaced apart relation to each other.

13. The method according to claim 11, comprising cooling the molten portion of the additional layer to the solidification temperature so as to solidify the portion of the additional layer, with the solidified portion of the additional layer comprising the discrete particles or eutectic colonies of the intermetallic compound and with the oxide particles produced from the disrupted oxidation of the molten granular material being in spaced apart relation to each other.

14. A method of manufacturing an object comprising:
determining a thickness of a metallic material coating comprising nickel for coating particles of a granular material based on a desired weight fraction of the metallic material coating relative to a weight of the overall particle of the granular material coated with the metallic material coating, wherein the desired weight fraction of the metallic material coating comprising nickel is between 3.8 and 29.2 percent by weight;
coating the particles of the granular material with the metallic material coating having the determined thickness; and
selectively heating a layer of a composition, comprising the particles of the granular material coated with the metallic material comprising nickel, to a threshold temperature using a laser in a selective laser melting (SLM) process so as to actuate an exothermic reaction between the particles of the granular material and the metallic material coating associated therewith and to form a molten portion of the layer including molten granular material, with turbulence in the molten portion of the layer disrupting oxidation of the molten granular material and promoting formation of an intermetallic compound in the molten portion of the layer upon cooling thereof below the threshold temperature.

15. The method according to claim 14, comprising cooling the molten portion of the layer to a solidification temperature, the solidification temperature being less than the threshold temperature, so as to solidify the portion of the layer, with the solidified portion of the layer comprising discrete particles or eutectic colonies of the intermetallic compound and with oxide particles produced from the disrupted oxidation of the molten granular material being in spaced apart relation to each other.

* * * * *